United States Patent
Iwashita et al.

(10) Patent No.: US 9,343,349 B2
(45) Date of Patent: May 17, 2016

(54) SUBSTRATE HOLDING APPARATUS AND SUBSTRATE HOLDING METHOD

(71) Applicant: TOKYO ELECTRON LIMITED, Tokyo (JP)

(72) Inventors: Yasuharu Iwashita, Koshi (JP); Osamu Hirakawa, Koshi (JP); Eiji Manabe, Koshi (JP); Takeshi Tamura, Koshi (JP); Akira Fukutomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 248 days.

(21) Appl. No.: 13/856,046

(22) Filed: Apr. 3, 2013

(65) Prior Publication Data

US 2013/0264780 A1    Oct. 10, 2013

(30) Foreign Application Priority Data

Apr. 4, 2012  (JP) .................................. 2012-085514
Mar. 12, 2013 (JP) .................................. 2013-049592

(51) Int. Cl.
*H01L 21/683* (2006.01)
*B23Q 3/08* (2006.01)

(52) U.S. Cl.
CPC ............ *H01L 21/6838* (2013.01); *B23Q 3/088* (2013.01); *Y10T 29/49998* (2015.01); *Y10T 279/11* (2015.01)

(58) Field of Classification Search
CPC .......................... B25B 11/005; B25B 11/007
See application file for complete search history.

(56) References Cited

U.S. PATENT DOCUMENTS

| | | | |
|---|---|---|---|
| 5,374,829 A * | 12/1994 | Sakamoto et al. | 250/453.11 |
| 5,564,682 A * | 10/1996 | Tsuji | 269/21 |
| 6,305,677 B1 * | 10/2001 | Lenz | 269/13 |
| 6,672,576 B1 * | 1/2004 | Walker | 269/21 |
| 2010/0133735 A1 * | 6/2010 | Katsuta | 269/21 |
| 2012/0049430 A1 * | 3/2012 | Aceti et al. | 269/21 |
| 2013/0264780 A1 * | 10/2013 | Iwashita et al. | 279/3 |

FOREIGN PATENT DOCUMENTS

| | | |
|---|---|---|
| JP | 07058191 A | 3/1995 |
| JP | 08039376 A | 2/1996 |
| JP | 11067882 A | 3/1999 |
| JP | 2009-194217 A | 8/2009 |
| WO | 2007114331 A1 | 10/2007 |

\* cited by examiner

*Primary Examiner* — Lee D Wilson
(74) *Attorney, Agent, or Firm* — Nath, Goldberg & Meyer; Jerald L. Meyer (57) ABSTRACT

In accordance with some embodiments of the present disclosure, a substrate holding apparatus is provided. The substrate holding apparatus includes a first holding part, a second holding part and a controller. The first holding part adsorbs and holds a first region including a central portion of a substrate. The second holding part adsorbs and holds a second region located outside the first region of the substrate. The second holding part adsorbs and holds the second region of the substrate after the first holding part adsorbs and holds the first region of the substrate.

8 Claims, 10 Drawing Sheets

SUBSTRATE HOLDING APPARATUS AND SUBSTRATE HOLDING METHOD

CROSS-REFERENCE TO RELATED APPLICATION

This application claims the benefit of Japanese Patent Application Nos. 2012-085514 and 2013-049592, filed on Apr. 4, 2012 and Mar. 12, 2013, respectively, in the Japan Patent Office, the disclosure of which is incorporated herein in their entirety by reference.

TECHNICAL FIELD

The present disclosure relates to a substrate holding apparatus and a substrate holding method.

BACKGROUND

There have been conventionally known a substrate holding apparatus for holding substrates such as silicon wafers, compound semiconductor wafers and the like. One example of the substrate holding apparatus may include a Bernoulli chuck which uses Bernoulli's principle to adsorb and hold a substrate in a non-contact state.

However, the above substrate holding apparatus had difficulty in holding a bent substrate. The reason is that, in case of the bent substrate, only gas is likely to be drawn into a space between a bottom surface of the bent substrate and a top surface of the holding apparatus.

SUMMARY

Some aspects of the present disclosure provide to a substrate holding apparatus and a substrate holding method which are capable of holding a bent substrate appropriately.

According to a first aspect of the present disclosure, a substrate holding apparatus includes a first holding part, a second holding part and a controller. The first holding part adsorbs and holds a first region including a central portion of a substrate. The second holding part adsorbs and holds a second region located outside the first region of the substrate. The second holding part adsorbs and holds the second region of the substrate after the first holding part adsorbs and holds the first region of the substrate.

According to a second aspect of the present disclosure, a substrate holding method includes adsorbing and holding a first region and a second region. The first region including a central portion of a substrate is adsorbed and held on a first holding part by activating the first holding part to adsorb and hold the first region. After adsorbing and holding the first region of the substrate on the first holding part, a second region located outside the first region of the substrate is adsorbed and held on a second holding part by activating the second holding part to adsorb and hold the second region.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Substrate holding apparatuses and substrate holding methods according to embodiments of the present disclosure will now be described in detail with reference to the accompanying drawings. Although it will be illustrated in the following embodiments that a substrate holding apparatus of the present disclosure is applied to a separation system for separating a superimposed substrate, the substrate holding apparatus may be applied to systems other than the separation system.

First Embodiment

<1. Separation System>

Figure 1:
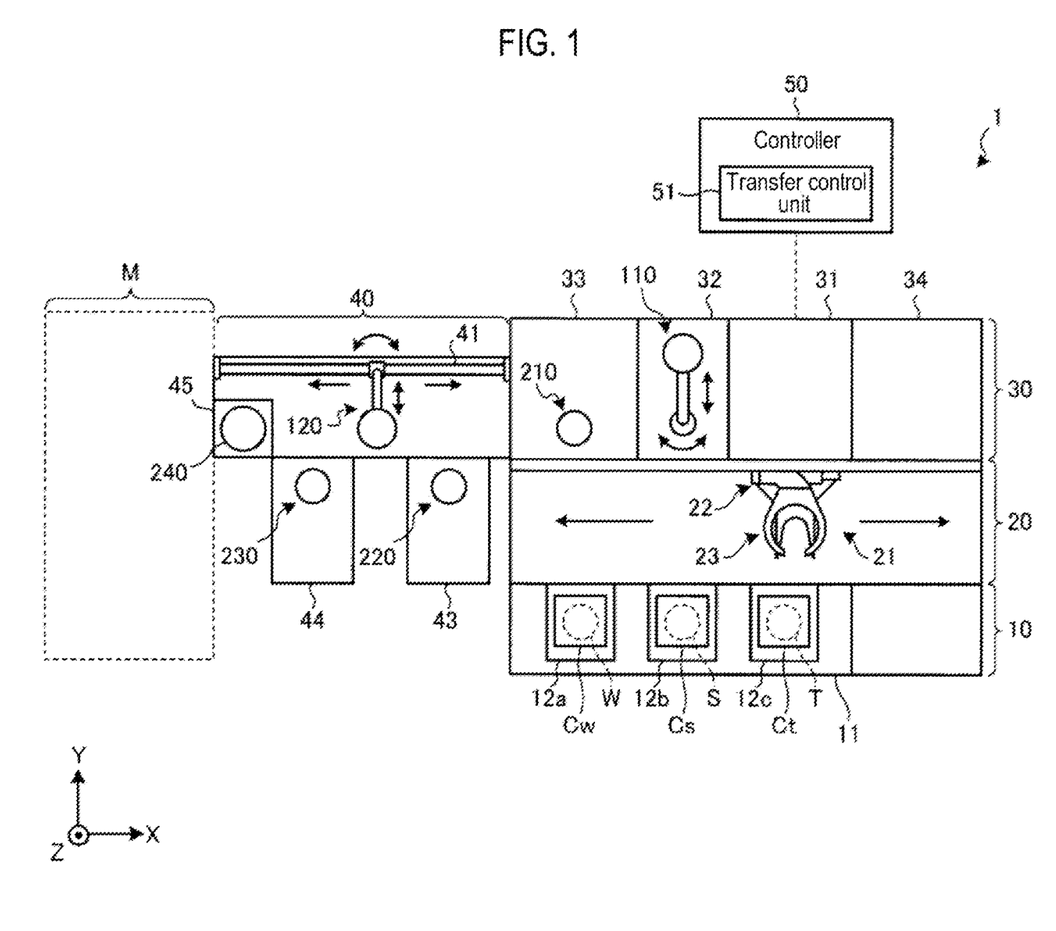
FIG. 1 is a schematic plane view showing a configuration of a separation system according to a first embodiment.
Figure 2:
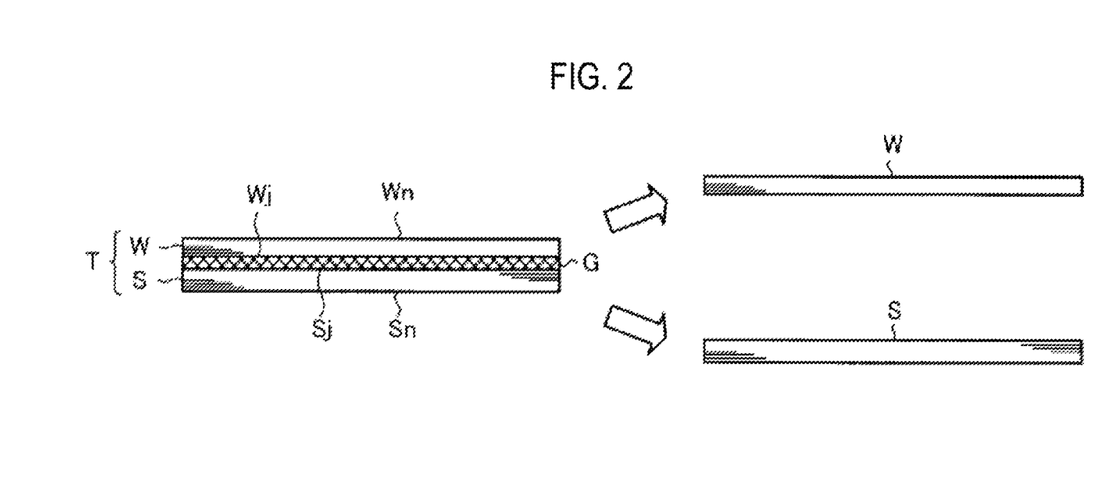
FIG. 2 is a schematic side view of a superimposed substrate, a process-targeted substrate and a support substrate.

First, a separation system according to a first embodiment of the present disclosure will be described with reference to FIGS. 1 and 2. FIG. 1 is a schematic plane view showing the configuration of the separation system according to the first embodiment. FIG. 2 is a schematic side view of a superimposed substrate, a process-targeted substrate and a support substrate. In the following description, for the purpose of clarity of positional relationships, X, Y and Z axes are defined to be orthogonal to one another and a positive Z direction is assumed to be a vertical upward direction.

According to the first embodiment, a separation system 1 shown in FIG. 1 is a system for separating a superimposed substrate T into the process-targeted substrate W and the support substrate S, which are joined to each other by means of an adhesive G (see FIG. 2).

Referring to FIG. 2, one of the surfaces of the process-targeted substrate W joined to the support substrate S by means of the adhesive G is referred to as a "junction surface Wj" and the other surface of the process-targeted substrate W opposite to the junction surface Wj is referred to as a "non-junction surface Wn." In addition, one of the surfaces of the support substrate S joined to the process-targeted substrate W by means of the adhesive G is referred to as a "junction surface Sj" and the other surface of the support substrate S opposite to the junction surface Sj is referred to as a "non-junction surface Sn."

The process-targeted substrate W is a semiconductor substrate, such as a silicon wafer and a compound semiconductor wafer, in which a plurality of electronic circuits is formed and assumes a surface of the process-targeted substrate W on which electronic circuits are formed as the junction surface Wj. In addition, the process-targeted substrate W is made in a thin type, for example, by polishing the non-junction surface Wn. The support substrate S has substantially the same diameter as the process-targeted substrate W and supports the process-targeted substrate W. An example of the support substrate S may include a silicon wafer, a compound semiconductor wafer, a glass substrate or the like.

Referring to FIG. 1 again, the separation system 1 includes a carrying-in/out station 10, a first transfer area 20, a separation processing station 30, a second transfer area 40 and a controller 50. The carrying-in/out station 10 and the separation processing station 30 are arranged in the Y axis direction with the first transfer area 20 interposed therebetween. The second transfer area 40 is arranged in the negative X axis direction of the carrying-in/out station 10, the first transfer area 20 and the separation processing station 30.

In the separation system 1, the superimposed substrate T carried into the carrying-in/out station 10 is transferred into the separation processing station 30 via the first transfer area 20, and is separated into the process-targeted substrate W and the support substrate S in the separation processing station 30. After the separation, the process-targeted substrate W is transferred into a post-process station M via the second transfer area 40 and the support substrate S is transferred into the carrying-in/out station 10 via the first transfer area 20. In addition, in the separation system 1, a defective process-targeted substrate W may be also transferred into the carrying-in/out station via the first transfer area 20.

In the carrying-in/out station 10, a cassette Cw for accommodating a plurality of process-targeted substrates W, a cassette Cs for accommodating a plurality of support substrates S and a cassette Ct for accommodating a plurality of superimposed substrates T are carried into/out of the separation system 1. The carrying-in/out station 10 is provided with a cassette mounting table 111 including a plurality of cassette mounting plates 12a to 12c on which the cassettes Cw, Cs and Ct are mounted, respectively. In addition, for example, a defective process-targeted substrate W transferred from the separation processing station 30 is received in the cassette Cw.

In the first transfer area 20, the process-targeted substrate W, the support substrate S and the superimposed substrate T are transferred between the carrying-in/out station 10 and the separation processing station 30. The first transfer area 20 is provided with a first transfer device 21 for transferring the process-targeted substrate W, the support substrate S and the superimposed substrate T.

The first transfer device 21 is a transfer robot including a transfer arm 22 which is horizontally and vertically movable and rotatable around a vertical axis, and a fork 23 attached to a leading end of the transfer arm 22. Such a first transfer device 21 uses the fork 23 to hold a substrate, while transferring the substrate that is held by the fork 23 to a desired place by means of the transfer arm 22.

In the separation processing station 30, the superimposed substrate T is separated into the process-targeted substrate W and the support substrate S, which are cleaned after the separation, and the other processes are then performed. The separation processing station 30 includes a separation device 31, an exchange chamber 32, a first cleaning device 33, and a second cleaning device 34, which are arranged to be aligned in the positive X axis direction in the order of the first cleaning device 33, the exchange chamber 32, the separation device 31 and the second cleaning device 34.

The separation device 31 performs a separation process of separating the superimposed substrate T transferred by the first transfer device 21 into the process-targeted substrate W and the support substrate S.

The exchange chamber 32 includes a second transfer device 110, which transfers the process-targeted substrate W separated from the superimposed substrate T by the separation device 31, into the first cleaning device 33. The second transfer device 110 is a Bernoulli chuck, which transfers the process-targeted substrate W to the first cleaning device 33 holding the substrate W in a non-contact state.

Here, the Bernoulli chuck sprays gas from a jetting hole provided in a holding plane toward a plane of the process-targeted substrate W, and holds the process-targeted substrate W in the non-contact state using a change in negative pressure due to a change in gas flow velocity in response to a gap between the holding plane and the plane of the process-targeted substrate W.

The first cleaning device 33 performs a cleaning process for the process-targeted substrate W transferred by the second transfer device 110. The first cleaning device 33 includes a spin chuck 210 which is rotated while adsorbing and holding the process-targeted substrate W. The first cleaning device 33 cleans the process-targeted substrate W by applying a cleaning solution to the process-targeted substrate W while rotating the process-targeted substrate W by means of the spin chuck 210. A detailed configuration of the first cleaning device 33 will be described with reference to FIG. 3.

The process-targeted substrate W cleaned by the first cleaning device 33 is, via the second transfer area 40, transferred into the post-process station M where a predetermined post-process is performed. As used herein, the "predetermined post-process" includes, for example, mounting the process-targeted substrate W, dicing the process-targeted substrate W into chips, and the like.

The second cleaning device 34 cleans the support substrate S that is separated from the superimposed substrate T by the separation device 31. The first transfer device 21 transfers the support substrate S that is cleaned by the second cleaning device 34 to the carrying-in/out station 10.

The second transfer area 40 is provided between the separation processing station 30 and the post-processing station M. The second transfer area 40 is provided with a third transfer device 120 which is movable on a transfer path 41 extended in the X axis direction. The third transfer device 120 transfers the process-targeted substrate W between the separation processing station 30 and the post-process station M. The third transfer device 120 uses the principle of Bernoulli chuck to transfer the process-targeted substrate W in the non-contact state, which is similar to the second transfer device 110.

In addition, the second transfer area 40 includes a third cleaning device 43 and a fourth cleaning device 44 which are arranged to be aligned in the negative X axis direction in the order of the third cleaning device 43 and the fourth cleaning device 44. The third cleaning device 43 and the fourth cleaning device 44 have the same configuration as the first cleaning device 33 and include respective spin chucks 220 and 230 having the same configuration as the spin chuck 210. The process-targeted substrate W is cleaned by the third cleaning device 43 and the fourth cleaning device 44, and is transferred to and from the post-process station M.

In addition, the second transfer area includes an exchange chamber 45 for transferring the process-targeted substrate W between the separation system 1 and the post-process station M. The exchange chamber 45 includes a porous chuck 240 for adsorbing and holding the process-targeted substrate W. The process-targeted substrate W cleaned by the third cleaning device 43 and the fourth cleaning device 44 is mounted on the porous chuck 240 by means of the third transfer device 120, and is adsorbed and held by the porous chuck 240.

The porous chuck 240 has no rotation function, unlike the spin chucks 210, 220 and 230, and is greater in diameter than the spin chuck 210 since it performs no cleaning process for the process-targeted substrate W.

The controller 50 is a device configured to control an operation of the separation system 1, and for example, includes a transfer control unit 51. The transfer control unit 51 is a processor configured to control, for example, the spin chuck 210 to adsorb and hold the process-targeted substrate W, or transfer the substrate by means of the second transfer device 110 and the third transfer device 120, and so on.

The controller 50 may be implemented with, for example, a computer to control an operation of the separation system 1 by reading and executing a program stored in a memory (not shown). This program may be recorded in a computer readable recording medium or installed from the recording medium into a memory of the controller 50. Examples of the computer readable recording medium may include a hard disk (HD), a flexible disk (FD), a compact disk (CD), a magneto-optical disk (MO), a memory card or the like.

The process-targeted substrate W has a thin thickness, for example 35 to 100 μm, and therefore, may easily be bent. In particular, if the process-targeted substrate W is bent into a concave shape, since an adsorption surface of the spin chuck 210 and the outer circumference of the process-targeted substrate W are distant from each other, it is difficult for the spin chuck 210 to adsorb and hold the process-targeted substrate W properly. Accordingly, the process-targeted substrate W may not properly be transferred between a substrate holding device, such as the second transfer device 110 and the third transfer device 120, and a substrate holding device, such as the spin chucks 210, 220 and 230 and the porous chuck 240.

According to the separation system 1 of the first embodiment, in order to avoid the above difficulty, the bended process-targeted substrate W is corrected by dividing the adsorption surface of the spin chuck 210 into a plurality of regions along the radial direction and adsorbing and holding the process-targeted substrate W from an inner region, gradationally.

A detailed configuration and operation of the spin chuck 210 that is one example of a substrate holding device in the present disclosure will be described. Meanwhile, the spin chucks 220, 230, and the porous chuck 240 that are another examples of the substrate holding device have the same or similar configuration as the spin chuck 210, thus detailed configurations and operations of the spin chucks 220, 230, and the porous chuck 240 will not be explained.

<2. Configuration of First Cleaning Device>

Figure 3:
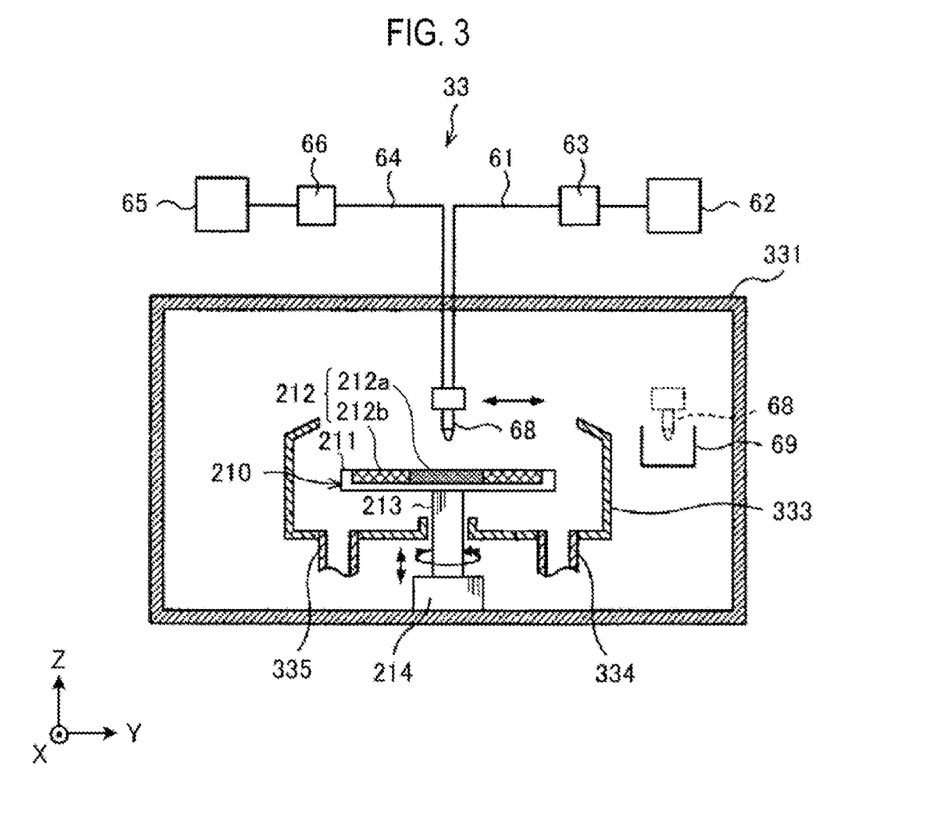
FIG. 3 is a schematic side view of a first cleaning device.

First, a configuration of the first cleaning device 33 will be described with reference to FIG. 3. FIG. 3 is a schematic side view of the first cleaning device 33.

As shown in FIG. 3, the first cleaning device 33 includes an air-tight process container 331. On a side of the process container 331 is formed a carrying-in/out hole (not shown) of the process-targeted substrate W, which is provided with an opening/closing shutter (not shown).

The spin chuck 210 configured to adsorb, hold and rotate the process-targeted substrate W is provided in the central portion of the process container 331. The spin chuck 210 includes a disk-shaped body 211 and an adsorbing/holding part 212 installed on the top side of the body 211.

The adsorbing/holding part 212 includes a porous member made of ceramic material such as silicon carbide or the like. The spin chuck 210 adsorbs and holds the process-targeted substrate W by adsorbing the process-targeted substrate W mounted on the top side of the body through the porous member of the adsorbing/holding part 212.

A support 213 is provided below the spin chuck 210. The support 213 has a bottom part supported by a base 214 and a top part supporting the spin chuck 210. The base 214 is fixed to, for example the floor of the process container 331.

The base 214 is provided with a driving part (not shown) such as a motor or the like to rotate the support 213. When the support 213 is rotated by the driving part, the spin chuck 210 is accordingly rotated. The driving part is provided with an elevation driving source to elevate the support 213 and the spin chuck 210, for example, using a cylinder.

A cup 333 for receiving and collecting liquid scattered or dropped from the process-targeted substrate W is disposed around the spin chuck 210. The bottom of the cup 333 is connected to a discharging pipe 334 discharging the collected liquid and an exhaust pipe 335 vacuum-absorbing and exhausting the atmosphere inside the cup 333.

In addition, the first cleaning device 33 includes a cleaning solution nozzle 68 for supplying a cleaning solution such as an organic solvent or the like onto the process-targeted substrate W. The cleaning solution nozzle 68 can be moved from a standby part 69 outside the cup 333 into the central position of the process-targeted substrate W inside the cup 333 along a rail (not shown) formed in the process container 331. The height of the cleaning solution nozzle 68 is adjusted up to the process-targeted substrate W by an elevation mechanism (not shown).

For example, the cleaning solution nozzle 68 is a nozzle configured to dispense two types of fluids, thus is connected to both a supply pipe 61 for supplying a cleaning solution and a supply pipe 64 for supplying inert gas such as nitrogen. A cleaning solution supply source 62 for storing the cleaning solution is connected to the supply pipe 61 via a supply device group 63 including a valve, a flow rate controller or the like for controlling a flow of cleaning solution. In addition, a cleaning solution supply source 65 for storing inert gas is connected to the supply pipe 64 via a supply device group 66 including a valve, a flow rate controller or the like for controlling a flow of inert gas.

The cleaning solution and the inert gas supplied into the cleaning solution nozzle 68 are mixed therein and are supplied from the cleaning solution nozzle 68 onto the process-targeted substrate W. The first cleaning device 33 cleans the process-targeted substrate W by supplying the cleaning solution or the like onto the process-targeted substrate W while rotating the spin chuck 210.

In the first cleaning device 33, the body 211 of the spin chuck 210 is formed to have a diameter smaller than the process-targeted substrate W so that the cleaning solution or the like can be supplied onto both front and rear surfaces of the process-targeted substrate W. Accordingly, an outer periphery than the spin chuck 210, specifically, an outer periphery than the adsorbing/holding part 212, cannot adsorb and held the substrate W. The process-targeted substrate W is likely kept to be bended in such situations.

According to the first embodiment, the adsorbing/holding part 212 includes a first holding part 212a and a second holding part 212b. More specifically, an adsorption surface of the adsorbing/holding part 212 is divided into an adsorption surface of the first holding part 212a and an adsorption surface of the second holding part 212b.

<3. Configuration and Operation of Spin Chuck>

Figure 4A:
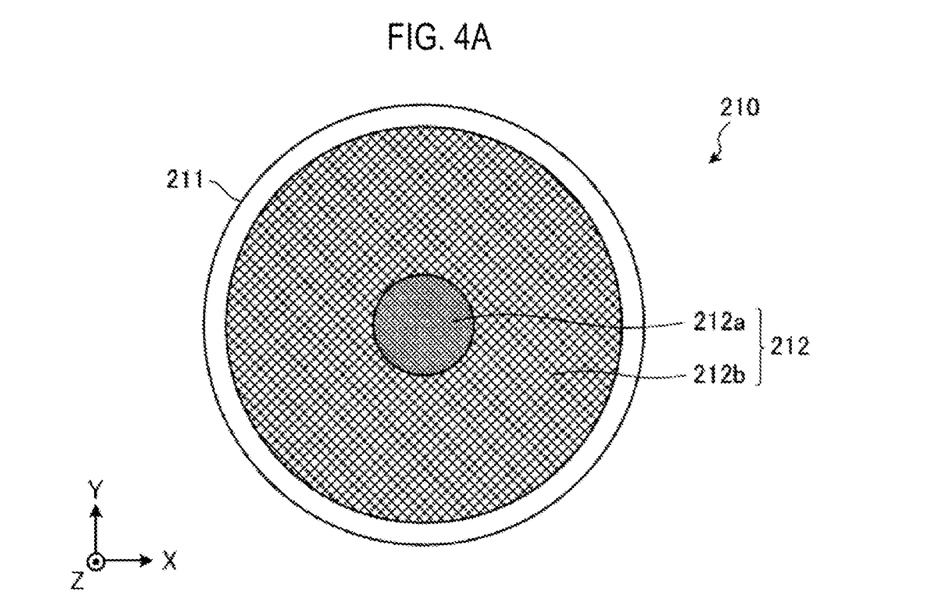
FIG. 4A is a schematic plane view of a spin chuck.
Figure 4B:
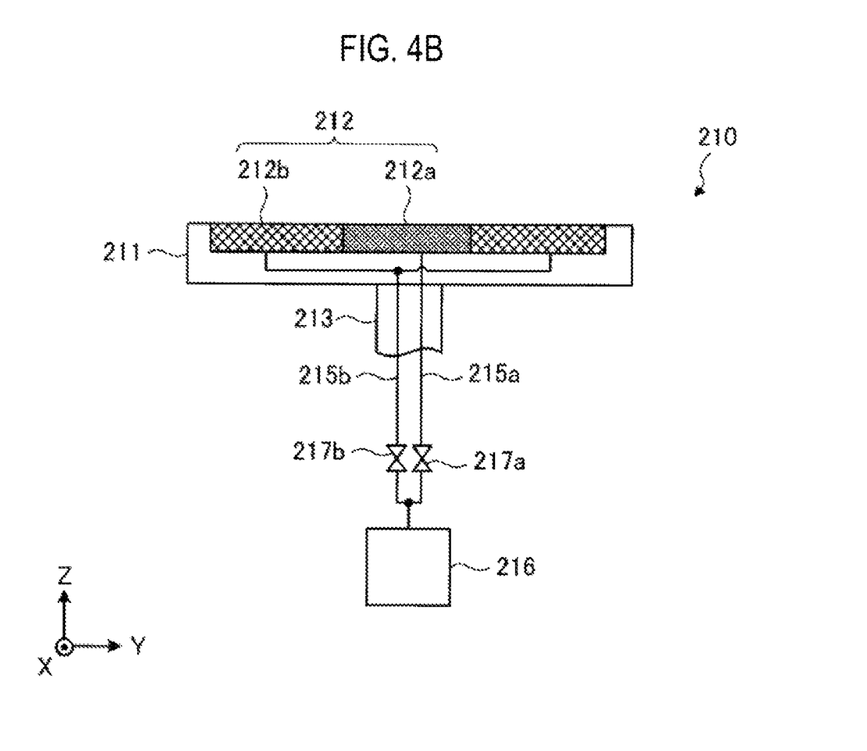
FIG. 4B is a view showing a connection relationship between a first holding part, a second holding part and an intake device.

Next, a configuration and operation of the spin chuck 210 will be described in more detail with reference to FIGS. 4A and 4B. FIG. 4A is a schematic plane view of the spin chuck 210. FIG. 4B is a view showing a connection relationship among the first holding part 212a, the second holding part 21b, and an intake device.

As shown in FIG. 4A, the adsorbing/holding part 212 is divided into the first holding part 212a and the second holding part 212b which are in concentricity with the body 211.

The first holding part 212a is disposed in the central portion of the body 211 and adsorbs and holds a region including the central portion of the process-targeted substrate W (hereinafter referred to as a "first region"). The second holding part 212b is disposed to outer periphery than the first holding part 212a and adsorbs and holds an outer region than the first region (hereinafter referred to as a "second region").

As shown in FIG. 4B, the first holding part 212a and the second holding part 212b are connected to an intake device 216. Specifically, the first holding part 212a is connected to the intake device 216 via an intake pipe 215a. The second holding part 212b is connected to the intake device 216 via an intake pipe 215b. For example, the intake device 216 is disposed within the base 214, and the intake pipes 215a and 215b are disposed within the support 213.

The intake pipes 215a and 215b are provided with respective valves 217a and 217b (corresponding to flow rate control valves) for adjusting flow rates of gases supplied into the intake device 216. The transfer control unit 51 of the controller 50 controls opening/closing of the valves 217a and 217b. The transfer control unit 51 controls operation timings of the first holding part 212a and the second holding part 212b, i.e., adsorption/holding timings of the process-targeted substrate W, by controlling the opening/closing of the valves 217a and 217b.

As described above, the spin chuck 210 has the rotation function. Accordingly, in this embodiment, the lines such as the intake pipes can be simplified by connecting the first holding part 212a and the second holding part 212b to the single intake device 216, thus the spin chuck can be rotated without the interference with the intake pipes and so on.

Figure 5A:
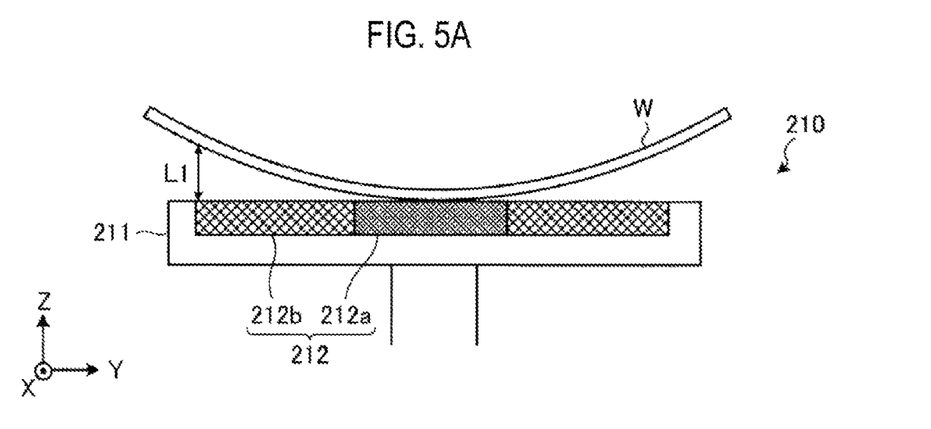
FIG. 5A is a view used to explain adsorbing/holding operation by a spin chuck.
Figure 5B:
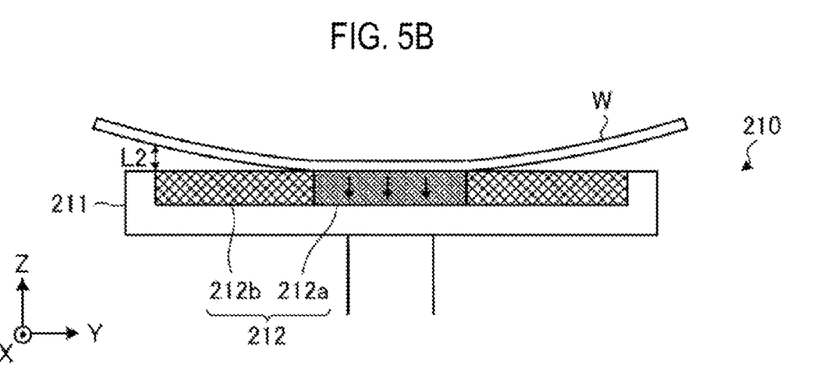
FIG. 5B is a view used to explain adsorbing/holding operation by a spin chuck.
Figure 5C:
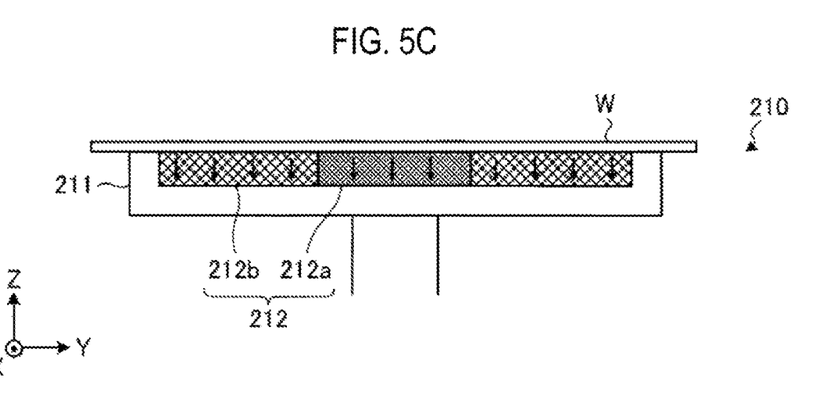
FIG. 5C is a view used to explain adsorbing/holding operation by a spin chuck.

Next, an operation in which the spin chuck 210 adsorbs/holds the process-targeted substrate W will be described with reference to FIGS. 5A to 5C. FIGS. 5A to 5C are views to explain the adsorbing/holding operations of the spin chuck 210.

As shown in FIG. 5A, it is assumed that the process-targeted substrate W is bent to be a concave shape over the spin chuck 210. That is, it is assumed that the outer periphery of the process-targeted substrate W is bent far away from the adsorbing/holding part 212 of the spin chuck 210. Here, L1 is assumed as the maximum distance between the process-targeted substrate W and the second holding part 212b until the first holding part 212a and the second holding part 212b are operated. For the purpose of easy understandings, bending of the process-targeted substrate W is shown to be exaggerated.

The transfer control unit 51 activates the first holding part 212a earlier than the second holding part 212b. Specifically, the transfer control unit 51 opens only the valve 217a (see FIG. 4B) so that only the first holding part 212a can intake gas.

In this manner, only the first holding part 212a intakes gas and the second holding part 212b does not draw gas. Thus the first holding part 212a can adsorb and hold the process-targeted substrate W with a stronger adsorption force. As a result, as shown in FIG. 5B, the first region including the central portion of the process-targeted substrate W can be adsorbed and held by the first holding part 212a. In addition, as the first region of the process-targeted substrate W is adsorbed and held by the first holding part 212a, the maximum distance between the process-targeted substrate W and the second holding part 212b is reduced from L1 to L2.

Subsequently, the transfer control unit 51 activates the second holding part 212b. Specifically, the transfer control unit 51 opens the valve 217b (see FIG. 4B) so that both of the first holding part 212a and the second holding part 212b can intake gas.

As such, the maximum distance between the process-targeted substrate W and the second holding part 212b is reduced from L1 to L2, thus the second holding part 212b can adsorb and hold the process-targeted substrate W more easily than in the case that the maximum distance is L1.

As a result, as shown in FIG. 5C, the second region of the process-targeted substrate W is adsorbed and held by the second holding part 212b, and the process-targeted substrate W is adsorbed and held on the entire surface of the adsorbing/holding part 212.

As described above, the spin chuck 210 according to the first embodiment includes the first holding part 212a and the second holding part 212b. The first holding part 212a adsorbs and holds the first region including the central portion of the process-targeted substrate W. The second holding part 212b adsorbs and holds the second region which is located outer than the first region of the process-targeted substrate W. In the first embodiment, the second holding part 212b adsorbs and holds the second region of the process-targeted substrate W after the first holding part 212a adsorbs and holds the first region of the process-targeted substrate W.

That is, the distance between the second holding part 212b and the process-targeted substrate W is reduced as the first holding part 212a adsorbs and holds the first region of the process-targeted substrate W. Then, the second holding part 212b adsorbs and holds the second region of the process-targeted substrate W. This allows the second holding part 212b to adsorb and hold the process-targeted substrate W even if the process-targeted substrate W is bent. Accordingly, the first embodiment allows the bent substrate to be properly held.

An adsorption area of the first holding part 212a (i.e., an area of the first region of the process-targeted substrate W) is made smaller than an adsorption area of the second holding part 212b (i.e., an area of the second region of the process-targeted substrate W) (see FIG. 4A). The reason is that the first holding part 212a aims primarily at decreasing the distance between the process-targeted substrate W and the second holding part 212b. That is, as the first holding part 212a reduces the distance between the process-targeted substrate W and the second holding part 212b as small as possible, the second holding part 212b is facilitated to adsorb and hold the process-targeted substrate W.

Regarding adsorption and holding the substrate, it is also assumed that the spin chuck 220 of the third cleaning device 43, the spin chuck 230 of the fourth cleaning device 44, and the porous chuck 240 of the exchange chamber 45 (see FIG. 1) have the same configuration and operation as the spin chuck 210.

Second Embodiment

Figure 6:
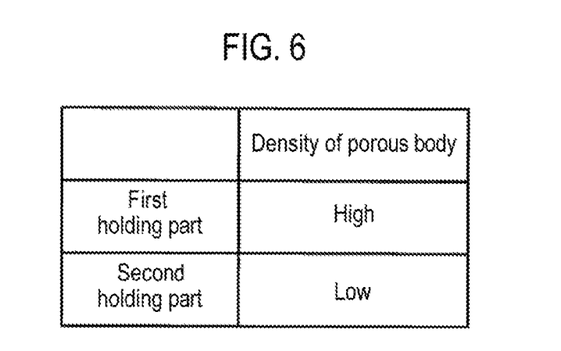
FIG. 6 is a view showing a density relationship between a porous member of a first holding part and a porous member of a second holding par in accordance with a second embodiment.

A porous member used for the first holding part 212a and a porous member used for the second holding part 212b need not be made of the same material but may be made of different materials. The porous members will be described with reference to FIG. 6. FIG. 6 is a view showing a density relationship between a porous member of the first holding part 212a and a porous member of the second holding part 212b in accordance with a second embodiment of the present disclosure.

As shown in FIG. 6, for example, it is possible to use the porous member of the first second holding part 212b having lower density than the porous member of the first holding part 212a. Hereinafter, the "lower density" means that the size of pores in the porous member is larger or the number of pores in the porous member is lower.

In this way, the porous member density of the second holding part 212b is set to be lower than that of the first holding part 212a. Thus, an adsorption force of the second holding part 212b can be relatively increased, so that a bent process-targeted substrate W can be more securely adsorbed and held.

In contrast, it is also possible to use the porous member of the second holding part 212b having higher density than the porous member of the first holding part 212a.

That is, in case that the first holding part 212a and the second holding part 212b are connected to a single intake device in the spin chuck 210 according to the first embodiment, the amount of intake gas into the first holding part 212a is decreased after the process state is changed as shown in FIGS. 5B to 5C, and thus an adsorption force of the first holding part 212a is weakened. As a result, the first holding part 212a may not completely adsorb and hold the process-targeted substrate W and the process-targeted substrate W is likely to return to its original bent state (i.e., the state shown in FIG. 5A).

In order to avoid this problem, the porous member density of the first holding part 212a is set to be lower than that of the second holding part 212b, and thus the adsorption force of the first holding part 212a is relatively strengthened, so that the process-targeted substrate W is difficult to return to its original bent state even after the process proceeds from the state shown in FIG. 5B to the state shown in FIG. 5C.

Third Embodiment

Figure 7:
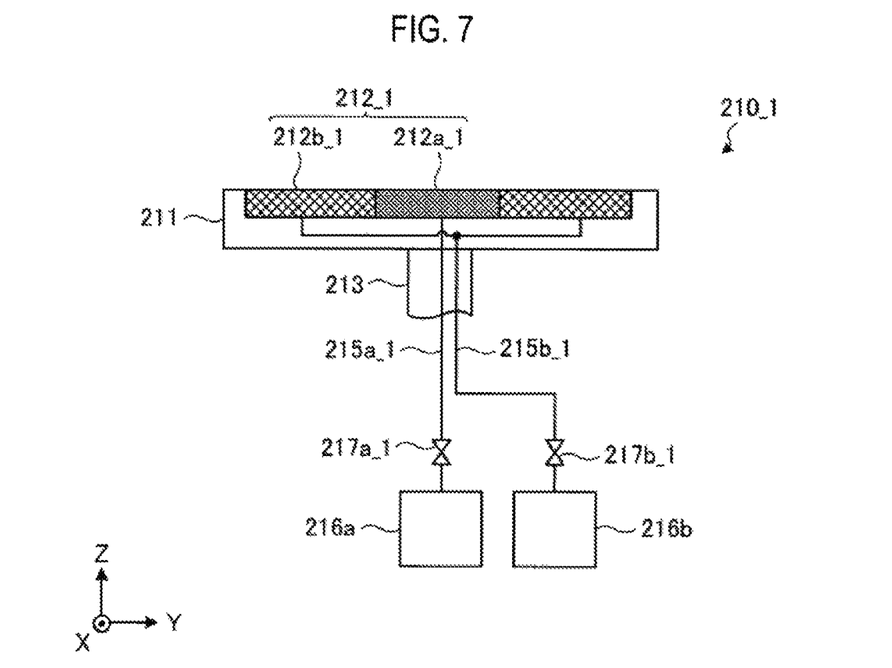
FIG. 7 is a view showing a connection relationship between a first holding part, a second holding part and intake devices in accordance with a third embodiment.

In the first embodiment above, the present disclosure has been described, giving as an example the case in which the first holding part 212a and the second holding part 212b are connected to the single intake device 216 (see FIG. 4B), but the first holding part and the second holding part may be respectively connected to different intake devices, as will be described with reference to FIG. 7 below. FIG. 7 is a view showing a connection relationship between a first holding part, a second holding part and intake devices in accordance with a third embodiment.

As shown in FIG. 7, an adsorbing/holding part 212_1 of a spin chuck 210_1 is divided into a first holding part 212a_1 and a second holding part 212b_1.

The first holding part 212a_1 is connected to an intake device 216a via an intake pipe 215a_1 and the second holding part 212b_1 is connected to an intake device 216b via an intake pipe 215b_1. The intake pipe 215a_1 is provided with a valve 217a_1 for adjusting a flow rate of gas supplied into the intake device 216a and the intake pipe 215b_1 is provided with a valve 217b_1 for adjusting a flow rate of gas supplied into the intake device 216b.

In this way, the first holding part 212a_1 and the second holding part 212b_1 may be connected to the respective intake devices 216a and 216b. Accordingly, an intake gas amount (adsorption force) of any one of the first holding part 212a_1 and the second holding part 212b_1 can remain unchanged while any one of the first holding part 212a_1 and the second holding part 212b_1 is activated. Thus, the first holding part 212a_1 and the second holding part 212b_1 can maintain the adsorbing operation, in a stable state.

Fourth Embodiment

Figure 8:
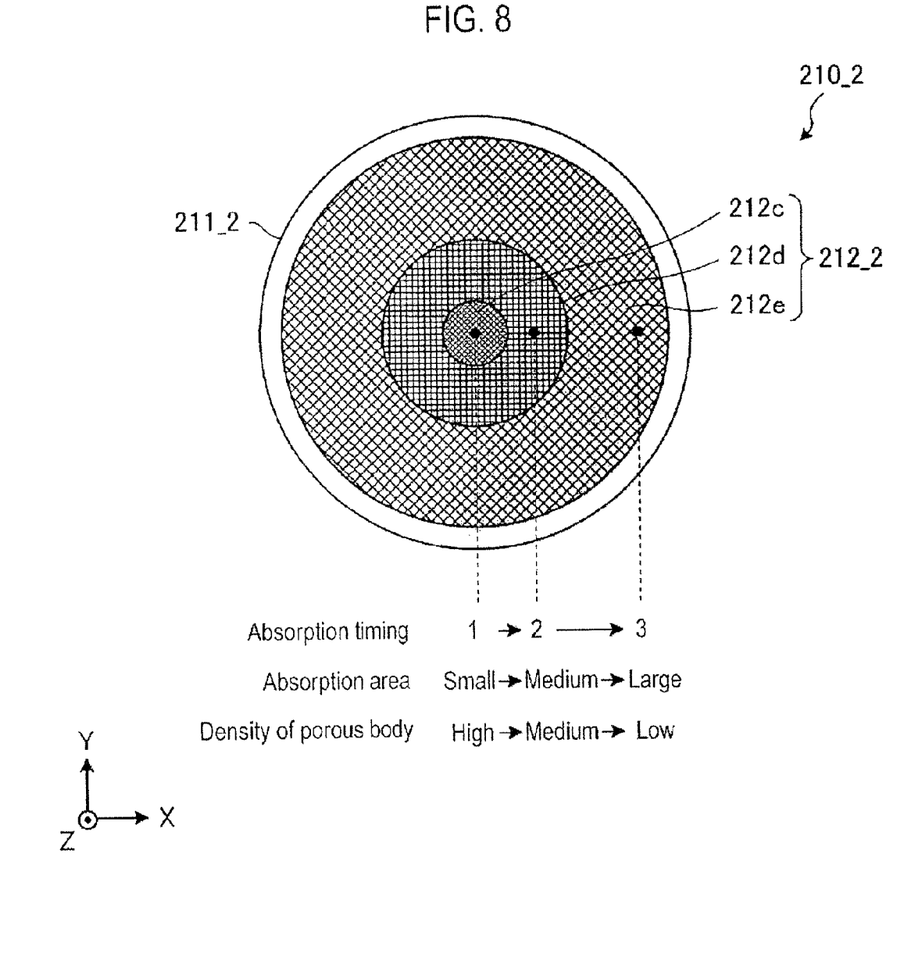
FIG. 8 is a schematic plane view showing another configuration of the spin chuck.

In the embodiments above, the present disclosure has been described, giving as an example the case in which the adsorbing/holding part is divided into the first holding part and the second holding part, but the adsorbing/holding part may be divided into three or more parts, as will be described with reference to FIG. 8 below. FIG. 8 is a schematic plane view showing another configuration of the spin chuck.

As shown in FIG. 8, an adsorbing/holding part 212_2 of a spin chuck 210_2 is divided into three parts, i.e., a first holding part 212c, a second holding part 212d, and a third holding part 212e. The first holding part 212c, the second holding part 212d, and the third holding part 212e are concentrically arranged in this order from the central portion of a body 211_2 toward its outer periphery.

The spin chuck 210_2 performs adsorption and holding of the process-targeted substrate W in the order of the first holding part 212c, the second holding part 212d and the third holding part 212e, i.e., in the order from the central portion of the body 211_2. Such increase in the number of divisional parts of the adsorbing/holding part 212_2 allows the bent process-targeted substrate W to be more smoothly corrected.

In addition, as described in the first embodiment, it is preferable that the adsorption areas of the first holding part 212c, the second holding part 212d and the third holding part 212e are increased in this order.

In addition, as described in the second embodiment, densities of the porous members of the first holding part 212c, the second holding part 212d and the third holding part 212e may be decreased in this order. Accordingly, an adsorption force of the second holding part 212d can be more strengthened than that of the first holding part 212c, and an adsorption force of the third holding part 212e can be more strengthened than that of the second holding part 212d, thereby allowing the bent process-targeted substrate W to be more reliably adsorbed and held.

Fifth Embodiment

Figure 9:
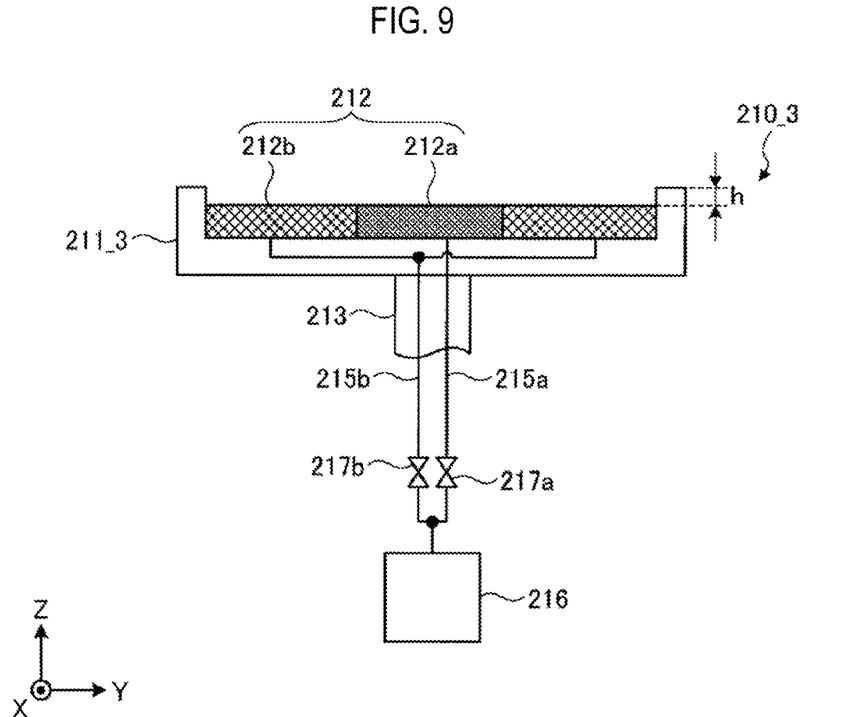
FIG. 9 is a schematic lateral view of a spin chuck in accordance with a fifth embodiment.

A configuration of a spin chuck in accordance with a fifth embodiment will be described with reference to FIG. 9. FIG. 9 is a schematic lateral view of a spin chuck in accordance with a fifth embodiment.

In the first to fourth embodiments, the present disclosure has been described, giving as an example the case in which the top side of the spin chuck (the holding surface of the process-targeted substrate W) is flat (see FIG. 4B). As shown in FIG. 9, in a spin chuck 210_3 according to a fifth embodiment, the top side of a body 211_3 arranged to surround the lower portion, and the edge of the adsorbing/holding part 212 is formed to be higher by a height h than the top side of the adsorbing/holding part 212 (the first holding part 212a and the second holding part 212b).

As described above, the outer periphery of the spin chuck 210_3 is formed to be higher by the height h than the top sides of the first holding part 212a and the second holding part 212b. Thus, a narrow space is formed among the outer periphery of the spin chuck 210_3, the adsorbing/holding part 212 and the process-targeted substrate W which is bent into a concave shape. Therefore, the spin chuck 210_3 can stably adsorb the process-targeted substrate W which is bent into the concave shape.

The height h is appropriately set to 0.1 to 1.0 mm or so. If the height h is less than 0.1 mm, it may be difficult to form the narrow space; and if the height h exceeds 1.0 mm, the process-targeted substrate W is likely to be broken when it is adsorbed.

An edge of the process-targeted substrate W may be bent, if the process-targeted substrate W is left without being held after is separated. To avoid the edge from being bent, the separated process-targeted substrate W is transferred to the spin chuck 210 while the substrate W is kept flat (not bent) by the second transfer device 110. Similarly, the process-targeted substrate W is transferred among the spin chucks 210, 220 and 230 and the porous chuck 240 while the substrate W is kept flat (not bent) by the third transfer device 120.

Here, when the second transfer device transfers the process-targeted substrate W to the spin chuck 210 with the substrate W flat (not bent), if a holding force of an edge of the spin chuck 210 is weak, the process-targeted substrate W returns to its original shape right after the process-targeted substrate W is passed from the second transfer device 110 to the spin chuck 210. That is, the edge of the process-targeted substrate W becomes bent. This is similarly applied to the spin chucks 220 and 230 and the porous chuck 240. However, according to the first to fifth embodiments, the edge of the process-targeted substrate W is not bent because it can be tightly held on the spin chucks 210, 220 and 230 and the porous chuck 240.

Sixth Embodiment

Figure 10:
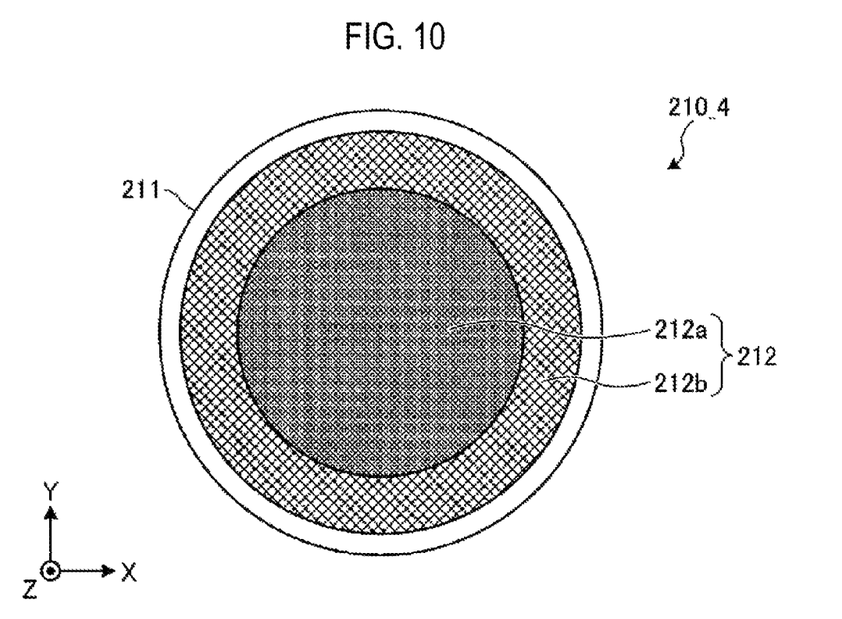
FIG. 10 is a schematic plane view showing an example of a spin chuck in accordance with a sixth embodiment.
Figure 11:
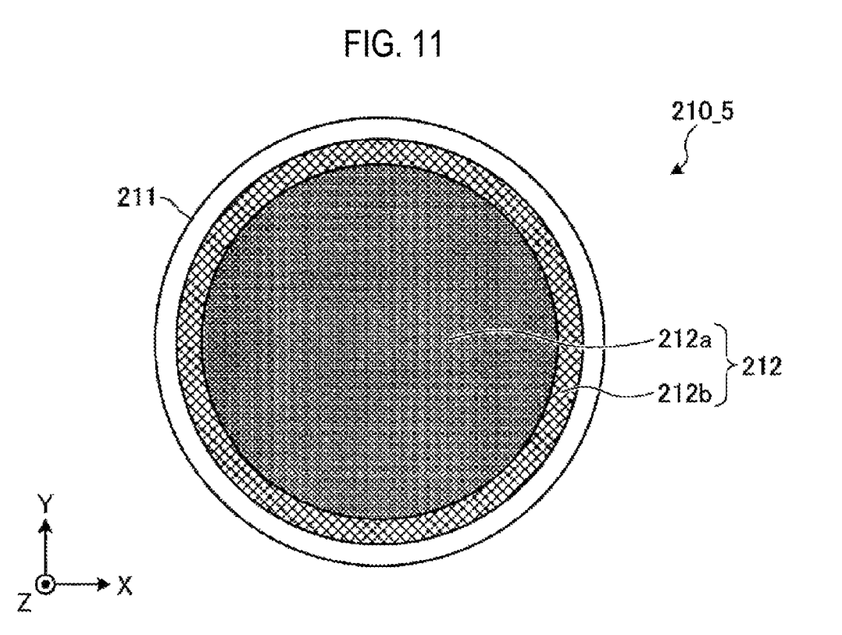
FIG. 11 is a schematic plane view showing another example of the spin chuck in accordance with the sixth embodiment.

A configuration of a spin chuck in accordance with a sixth embodiment will be described with reference to FIGS. 10 and 11. FIG. 10 is a schematic plane view showing an example of a spin chuck in accordance with a sixth embodiment. FIG. 11 is a schematic plane view showing another example of the spin chuck in accordance with the sixth embodiment.

In the first embodiment, the present disclosure has been described, giving as an example the case in which the adsorption area of the first holding part 212a is smaller than the adsorption area of the second holding part 212b. However, as a spin chuck 210_4 shown in FIG. 10, the adsorption area of the first holding part 212a may be equal to the adsorption area of the second holding part 212b. In addition, as a spin chuck 210_5 shown in FIG. 11, the adsorption area of the first holding part 212a may be larger than the adsorption area of the second holding part 212b. In all cases, the process-targeted substrate W can be held without being bent because the first holding part 212a and the second holding part 212b are provided.

The above-described first to sixth embodiments may be appropriately practiced in combination. This combination allows the bent process-targeted substrate W to be more appropriately held.

According to some embodiments of the present disclosure, a bent substrate can be appropriately held.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate holding apparatus comprising:
a first holding part configured to adsorb and hold a first region including a central portion of a substrate; and
a second holding part configured to adsorb and hold a second region located outside the first region of the substrate,
wherein the second holding part starts to adsorb and hold the second region of the substrate, after the first holding part adsorbs and holds the first region of the substrate and when a distance between the substrate and the second holding part is reduced to a predetermined distance, and
wherein the first holding part and the second holding part are formed to include respective porous members on which the substrate is adsorbed and held, and a porous member used for the first holding part has a different density from a porous member of the second holding part.

2. The substrate holding apparatus of claim 1, wherein an area of the first holding part adsorbed on the substrate is smaller than an area of the second holding part adsorbed on the substrate.

3. The substrate holding apparatus of claim 1, wherein an area in which the first holding part adsorbs the substrate corresponds an area on which the second holding part adsorbs the substrate.

4. The substrate holding apparatus of claim 1, wherein the first holding part and the second holding part are connected to a single intake device via respective flow rate control valves configured to control flow rates to the first holding part and the second holding part.

5. A substrate holding apparatus comprising:
a first holding part configured to adsorb and hold a first region including a central portion of a substrate;
a second holding part configured to adsorb and hold a second region located outside the first region of the substrate; and
a body arranged to surround an edge of the second holding part, the top side of the body being formed to be higher than the top side of the second holding part,
wherein the second holding part starts to adsorb and hold the second region of the substrate, after the first holding part adsorbs and holds the first region of the substrate and when a distance between the substrate and the second holding part is reduced to a predetermined distance.

6. The substrate holding apparatus of claim 5, wherein an area of the first holding part adsorbed on the substrate is smaller than an area of the second holding part adsorbed on the substrate.

7. The substrate holding apparatus of claim 5, wherein an area in which the first holding part adsorbs the substrate corresponds an area on which the second holding part adsorbs the substrate.

8. The substrate holding apparatus of claim 5, wherein the first holding part and the second holding part are connected to a single intake device via respective flow rate control valves configured to control flow rates to the first holding part and the second holding part.

\* \* \* \* \*